US010173919B2

(12) United States Patent
Aitken et al.

(10) Patent No.: US 10,173,919 B2
(45) Date of Patent: *Jan. 8, 2019

(54) FUSION FORMABLE SODIUM FREE GLASS

(71) Applicant: Corsam Technologies LLC, Corning, NY (US)

(72) Inventors: Bruce Gardiner Aitken, Corning, NY (US); James Edward Dickinson, Jr., Corning, NY (US); Timothy J. Kiczenski, Corning, NY (US); Michelle Diane Pierson-Stull, Painted Post, NY (US)

(73) Assignee: Corsam Technologies LLC, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/651,654

(22) Filed: Jul. 17, 2017

(65) Prior Publication Data

US 2017/0334764 A1    Nov. 23, 2017

Related U.S. Application Data

(63) Continuation of application No. 15/041,697, filed on Feb. 11, 2016, now abandoned, which is a continuation of application No. 12/788,763, filed on May 27, 2010, now Pat. No. 9,371,247.

(60) Provisional application No. 61/182,404, filed on May 29, 2009.

(51) Int. Cl.
| | | |
|---|---|---|
| B32B 17/00 | (2006.01) | |
| C03C 3/064 | (2006.01) | |
| C03C 3/078 | (2006.01) | |
| C03C 3/089 | (2006.01) | |
| C03C 3/091 | (2006.01) | |
| H01L 31/0296 | (2006.01) | |
| H01L 31/032 | (2006.01) | |
| H01L 31/048 | (2014.01) | |

(52) U.S. Cl.
CPC ............ *C03C 3/064* (2013.01); *C03C 3/078* (2013.01); *C03C 3/089* (2013.01); *C03C 3/091* (2013.01); *H01L 31/0296* (2013.01); *H01L 31/0322* (2013.01); *H01L 31/048* (2013.01); *Y02E 10/541* (2013.01); *Y02P 70/521* (2015.11)

(58) Field of Classification Search
USPC ................................. 428/426, 428
See application file for complete search history.

(56) References Cited

U.S. PATENT DOCUMENTS

| | | | |
|---|---|---|---|
| 5,017,521 A | 5/1991 | Yale et al. | |
| 5,256,601 A | 10/1993 | Kerko et al. | |
| 5,411,601 A * | 5/1995 | Higuchi | H01L 31/0392 136/256 |
| 5,631,195 A | 5/1997 | Yanagisawa et al. | |
| 5,780,373 A | 7/1998 | Yanagisawa et al. | |
| 5,895,719 A | 4/1999 | Fyles et al. | |
| 5,908,794 A | 6/1999 | Maeda et al. | |
| 5,925,583 A | 7/1999 | Yoshii et al. | |
| 6,063,718 A | 5/2000 | El Khiati et al. | |
| 6,162,749 A | 12/2000 | Brocheton et al. | |
| 6,188,013 B1 | 2/2001 | Inaba et al. | |
| 6,207,603 B1 | 3/2001 | Danielson et al. | |
| 6,313,052 B1 | 11/2001 | Nakashima et al. | |
| 6,319,867 B1 | 11/2001 | Chacon et al. | |
| 6,630,420 B1 | 10/2003 | Naumann et al. | |
| 6,680,266 B1 | 1/2004 | Peuchert et al. | |
| 6,974,976 B2 | 12/2005 | Hollars | |
| RE38,959 E | 1/2006 | Kohli | |
| 6,992,030 B2 | 1/2006 | Paulson | |
| 7,087,541 B2 | 8/2006 | Kohli | |
| 7,517,822 B2 | 4/2009 | Fechner et al. | |
| 7,670,976 B2 | 3/2010 | Lee et al. | |
| 7,951,734 B2 | 5/2011 | Nishizawa et al. | |
| 8,093,793 B2 | 1/2012 | Hoshimure et al. | |
| 8,187,714 B2 | 5/2012 | Le Bellac et al. | |
| 9,371,247 B2 | 6/2016 | Aitken et al. | |
| 2003/0087746 A1 | 5/2003 | Ritter et al. | |
| 2003/0114292 A1 | 6/2003 | Kolberg et al. | |
| 2004/0132604 A1 | 7/2004 | Grun et al. | |
| 2005/0209084 A1 | 9/2005 | Takaya et al. | |
| 2006/0219288 A1 | 10/2006 | Tuttle | |
| 2007/0193623 A1 | 8/2007 | Krasnov | |
| 2007/0265155 A1 | 11/2007 | Cornelius et al. | |

(Continued)

FOREIGN PATENT DOCUMENTS

| | | |
|---|---|---|
| CN | 101074146 A | 11/2007 |
| EP | 0396896 A1 | 11/1990 |

(Continued)

OTHER PUBLICATIONS

WO2008099687 English machine translation.*
Yang et al., "Cathodoluminescence and depth profiles of tin in float glass," J. Phys. D Appl. Phys. 27 (Mar. 1994) 1757-1762.
International Search Report dated Nov. 24, 2010 in PCT Application No. PCT/US2010/036508.
JP Office Action dated Dec. 6, 2016 from a corresponding application.

*Primary Examiner* — Lauren R Colgan
(74) *Attorney, Agent, or Firm* — John P. McGroarty

(57) ABSTRACT

A compositional range of fusion-formable, high strain point sodium free, silicate, aluminosilicate and boroaluminosilicate glasses are described herein. The glasses can be used as substrates for photovoltaic devices, for example, thin film photovoltaic devices such as CIGS photovoltaic devices. These glasses can be characterized as having strain points ≥540° C., thermal expansion coefficient of from 6.5 to 10.5 ppm/° C., as well as liquidus viscosities in excess of 50,000 poise. As such they are ideally suited for being formed into sheet by the fusion process.

17 Claims, No Drawings

(56) References Cited

U.S. PATENT DOCUMENTS

| | | |
|---|---|---|
| 2008/0020919 A1 | 1/2008 | Murata |
| 2008/0072956 A1 | 3/2008 | Sharma et al. |
| 2008/0128923 A1 | 6/2008 | Saito et al. |
| 2008/0308146 A1 | 12/2008 | Krasnov et al. |
| 2009/0197088 A1 | 8/2009 | Murata |
| 2009/0239008 A1 | 9/2009 | Ovutthitham |
| 2009/0275462 A1 | 11/2009 | Murata |
| 2009/0286091 A1 | 11/2009 | Danielson et al. |
| 2010/0084016 A1 | 4/2010 | Aitken et al. |
| 2011/0094584 A1 | 4/2011 | Sawada et al. |

FOREIGN PATENT DOCUMENTS

| | | |
|---|---|---|
| FR | 2759077 A1 | 8/1998 |
| GB | 1340763 A | 1/1974 |
| JP | 56145132 | 11/1981 |
| JP | 08-133778 | 5/1996 |
| JP | H09301733 A | 11/1997 |
| JP | H10152338 A | 6/1998 |
| JP | H10291827 A | 11/1998 |
| JP | 11135819 | 5/1999 |
| JP | 11-180727 | 7/1999 |
| JP | 11180728 | 7/1999 |
| JP | 11-310433 | 11/1999 |
| JP | H11310430 A | 11/1999 |
| JP | H11310432 A | 11/1999 |
| JP | 11335133 | 12/1999 |
| JP | 2001294441 A | 10/2001 |
| JP | 2002025762 A | 1/2002 |
| JP | 2002053340 A | 2/2002 |
| JP | 2002198504 A | 7/2002 |
| JP | 2003073142 A | 3/2003 |
| JP | 2003261352 A | 9/2003 |
| JP | 2004035295 A | 2/2004 |
| JP | 2004238283 A | 8/2004 |
| JP | 2004244257 A | 9/2004 |
| JP | 2005089286 A | 4/2005 |
| JP | 2005-255520 A | 9/2005 |
| JP | 2006137631 A | 6/2006 |
| JP | 2006188406 A | 7/2006 |
| JP | 2007246365 A | 9/2007 |
| JP | 2008088005 A | 4/2008 |
| JP | 2008280189 A | 11/2008 |
| WO | WO-2006137683 A1 | 12/2006 |
| WO | WO-2007052489 A1 | 5/2007 |
| WO | WO2008099687 | * 8/2008 |

* cited by examiner

FUSION FORMABLE SODIUM FREE GLASS

This application is a continuation of U.S. patent application Ser. No. 15/041,697, filed on Feb. 11, 2016; which is a continuation of U.S. patent application Ser. No. 12/788,763 filed on May 27, 2010, now U.S. Pat. No. 9,371,247; which claims benefit of U.S. Provisional Application No. 61/182,404 filed on May 29, 2009. The disclosures of all of these are hereby incorporated by reference.

BACKGROUND

Field

Embodiments relate generally to sodium free glasses and more particularly to fusion formable sodium free glasses which may be useful in photochromic, electrochromic, Organic Light Emitting Diode (OLED) lighting, or photovoltaic applications, for example, thin film photovoltaics.

Technical Background

The fusion forming process typically produces flat glass with optimal surface and geometric characteristics useful for many electronics applications, for instance, substrates used in electronics applications, for example, display glass for LCD televisions.

Over the last 10 years, Corning fusion glass products include 1737F™, 1737G™, Eagle2000F™, EagleXG™, Jade™, and Codes 1317 and 2317 (Gorilla Glass™). Efficient melting is generally believed to occur at a temperature corresponding to a melt viscosity of about 200 poise (p). These glasses share in common 200p temperatures in excess of 1600° C., which can translate to accelerated tank and electrode corrosion, greater challenges for fining due to still more elevated finer temperatures, and/or reduced platinum system life time, particularly around the finer. Many have temperatures at 3000 poise in excess of about 1300° C., and since this is a typical viscosity for an optical stirrer, the high temperatures at this viscosity can translate to excessive stirrer wear and elevated levels of platinum defects in the body of the glass.

Many of the above described glasses have delivery temperatures in excess of 1200° C., and this can contribute to creep of isopipe refractory materials, particularly for large sheet sizes.

These attributes combine so as to limit flow (because of slow melt rates), to accelerate asset deterioration, to force rebuilds on timescales much shorter than product lifetimes, to force unacceptable (arsenic), expensive (capsule) or unwieldy (vacuum fining) solutions to defect elimination, and thus contribute in significant ways to the cost of manufacturing glass.

In applications in which rather thick, comparatively low-cost glass with less extreme properties is required, these glasses are not only overkill, but prohibitively expensive to manufacture. This is particularly true when the competitive materials are made by the float process, a very good process for producing low cost glass with rather conventional properties. In applications that are cost sensitive, such as large-area photovoltaic panels and OLED lighting, this cost differential is so large as to make the price point of LCD-type glasses unacceptable.

To reduce such costs, it is advantageous to drive down the largest overall contributors (outside of finishing), and many of these track directly with the temperatures used in the melting and forming process. Therefore, there is a need for a glass that melts at a lower temperature than those aforementioned glasses.

Further, it would be advantageous to have a glass useful for low temperature applications, for instance, photovoltaic and OLED light applications. Further, it would be advantageous to have a glass whose processing temperatures were low enough that the manufacturing of the glass would not excessively consume the energy that these applications are aiming to save.

SUMMARY

A compositional range of fusion-formable, high strain point sodium free, silicate, aluminosilicate and boroaluminosilicate glasses useful, for example, for thin-film photovoltaic applications are described herein. More specifically, these glasses are advantageous materials to be used in copper indium gallium diselenide (CIGS) photovoltaic modules where the sodium required to optimize cell efficiency is not to be derived from the substrate glass but instead from a separate deposited layer consisting of a sodium containing material such as NaF. Current CIGS module substrates are typically made from soda-lime glass sheet that has been manufactured by the float process. However, use of higher strain point glass substrates can enable higher temperature CIGS processing, which is expected to translate into desirable improvements in cell efficiency. Moreover, it may be that the smoother surface of fusion-formed glass sheets yields additional benefits, such as improved film adhesion, etc.

Accordingly, the sodium free glasses described herein can be characterized by strain points ≥540° C., for example, ≥560° C. so as to provide advantage with respect to soda-lime glass and/or liquidus viscosity ≥30,000 poise to allow manufacture via the fusion process. In order to avoid thermal expansion mismatch between the substrate and CIGS layer, the inventive glasses are further characterized by a thermal expansion coefficient in the range of from 6.5 to 10.5 ppm/°C.

One embodiment is a glass comprising, in weight percent:
  35 to 75 percent $SiO_2$;
  0 to 15 percent $Al_2O_3$;
  0 to 20 percent $B_2O_3$;
  3 to 30 percent $K_2O$;
  0 to 15 percent MgO;
  0 to 10 percent CaO;
  0 to 12 percent SrO;
  0 to 40 percent BaO; and
  0 to 1 percent $SnO_2$,
  wherein the glass is substantially free of $Na_2O$.

In another embodiment, the glass comprises, in weight percent:
  35 to 75 percent $SiO_2$;
  greater than 0 to 15 percent $Al_2O_3$;
  greater than 0 to 20 percent $B_2O_3$;
  3 to 30 percent $K_2O$;
  greater than 0 to 15 percent MgO;
  greater than 0 to 10 percent CaO;
  greater than 0 to 12 percent SrO;
  greater than 0 to 40 percent BaO; and
  greater than 0 to 1 percent $SnO_2$,
  wherein the glass is substantially free of $Na_2O$.

In another embodiment, the glass comprises, in weight percent:
  39 to 75 percent $SiO_2$;
  2 to 13 percent $Al_2O_3$;
  1 to 11 percent $B_2O_3$;
  3 to 30 percent $K_2O$;
  0 to 7 percent MgO;

0 to 10 percent CaO;
0 to 12 percent SrO;
0 to 40 percent BaO; and
0 to 1 percent $SnO_2$,
wherein the glass is substantially free of $Na_2O$.

In another embodiment, the glass comprises, in weight percent:
50 to 70 percent $SiO_2$;
2 to 13 percent $Al_2O_3$;
1 to 11 percent $B_2O_3$;
3 to 30 percent $K_2O$;
0 to 7 percent MgO;
0 to 7 percent CaO;
0 to 5 percent SrO;
1 to 40 percent BaO; and
0 to 0.3 percent $SnO_2$,
wherein the glass is substantially free of $Na_2O$.

Another embodiment is a glass consisting essentially of, in weight percent:
35 to 75 percent $SiO_2$;
0 to 15 percent $Al_2O_3$;
0 to 20 percent $B_2O_3$;
3 to 30 percent $K_2O$;
0 to 15 percent MgO;
0 to 10 percent CaO;
0 to 12 percent SrO;
0 to 40 percent BaO; and
0 to 1 percent $SnO_2$,
wherein the glass is substantially free of $Na_2O$.

Another embodiment is a glass comprising, in weight percent:
45 to 75 percent $SiO_2$;
3 to 15 percent $Al_2O_3$;
0 to 20 percent $B_2O_3$;
14 to 25 percent $K_2O$;
0 to 15 percent MgO;
0 to 10 percent CaO;
0 to 12 percent SrO;
0 to 40 percent BaO; and
0 to 1 percent $SnO_2$,
wherein the glass is substantially free of $Na_2O$ and wherein the glass is fusion formable and has a strain point of 540° C. or greater, a coefficient of thermal expansion of $50 \times 10^{-7}$ or greater, $T_{200}$ less than 1630° C., and having a liquidus viscosity of 150,000 poise or greater.

Additional features and advantages will be set forth in the detailed description which follows, and in part will be readily apparent to those skilled in the art from the description or recognized by practicing the invention as described in the written description and claims hereof.

It is to be understood that both the foregoing general description and the following detailed description are merely exemplary of the invention, and are intended to provide an overview or framework for understanding the nature and character of the invention as it is claimed.

DETAILED DESCRIPTION

Reference will now be made in detail to various embodiments of the invention.

As used herein, the term "substrate" can be used to describe either a substrate or a superstrate depending on the configuration of the photovoltaic cell. For example, the substrate is a superstrate, if when assembled into a photovoltaic cell, it is on the light incident side of a photovoltaic cell. The superstrate can provide protection for the photovoltaic materials from impact and environmental degradation while allowing transmission of the appropriate wavelengths of the solar spectrum. Further, multiple photovoltaic cells can be arranged into a photovoltaic module. Photovoltaic device can describe either a cell, a module, or both.

As used herein, the term "adjacent" can be defined as being in close proximity. Adjacent structures may or may not be in physical contact with each other. Adjacent structures can have other layers and/or structures disposed between them.

One embodiment is a glass comprising, in weight percent:
35 to 75 percent $SiO_2$;
0 to 15 percent $Al_2O_3$;
0 to 20 percent $B_2O_3$;
3 to 30 percent $K_2O$;
0 to 15 percent MgO;
0 to 10 percent CaO;
0 to 12 percent SrO;
0 to 40 percent BaO; and
0 to 1 percent $SnO_2$,
wherein the glass is substantially free of $Na_2O$.

Another embodiment is a glass comprising, in weight percent:
45 to 75 percent $SiO_2$;
3 to 15 percent $Al_2O_3$;
0 to 20 percent $B_2O_3$;
14 to 25 percent $K_2O$;
0 to 15 percent MgO;
0 to 10 percent CaO;
0 to 12 percent SrO;
0 to 40 percent BaO; and
0 to 1 percent $SnO_2$,
wherein the glass is substantially free of $Na_2O$ and wherein the glass is fusion formable and has a strain point of 540° C. or greater, a coefficient of thermal expansion of $50 \times 10^{-7}$ or greater, $T_{200}$ less than 1630° C., and having a liquidus viscosity of 150,000 poise or greater.

In another embodiment, the glass consists essentially of in weight percent:
45 to 75 percent $SiO_2$;
3 to 15 percent $Al_2O_3$;
0 to 20 percent $B_2O_3$;
14 to 25 percent $K_2O$;
0 to 15 percent MgO;
0 to 10 percent CaO;
0 to 12 percent SrO;
0 to 40 percent BaO; and
0 to 1 percent $SnO_2$,
wherein the glass is substantially free of $Na_2O$ and wherein the glass is fusion formable and has a strain point of 540° C. or greater, a coefficient of thermal expansion of $50 \times 10^{-7}$ or greater, $T_{200}$ less than 1630° C., and having a liquidus viscosity of 150,000 poise or greater.

The glass is substantially free of $Na_2O$, for example, the content of $Na_2O$ can be 0.05 weight percent or less, for example, zero weight percent. The glass, according to some embodiments, is free of intentionally added sodium.

In some embodiments, the glass comprises greater than 3 percent $K_2O$, for example, greater than 5 percent $K_2O$, for example, greater than 10 percent $K_2O$, for example, greater than 12 percent $K_2O$, for example greater than 13.5 percent $K_2O$, for example, greater than 15 percent $K_2O$.

Since the glass is substantially free of $Na_2O$, in some embodiments, the weight percent of the combination of $Na_2O$ and $K_2O$ is greater than 3 percent, for example, greater than 5 percent, for example, greater than 10 percent, for example, greater than 12 percent, for example greater than 13.5 percent, for example, greater than 15 percent.

In some embodiments, the glass comprises at least 45 percent $SiO_2$, for example, at least 50 percent $SiO_2$, for example, at least 60 percent $SiO_2$.

The glass, in one embodiment, is rollable. The glass, in one embodiment, is down-drawable. The glass can be slot drawn or fusion drawn, for example. According to another embodiment the glass can be float formed.

The glass can further comprise 3 weight percent or less, for example, 0 to 3 weight percent, for example, greater than 0 to 3 weight percent, for example, 1 to 3 weight percent of $TiO_2$, MnO, ZnO, $Nb_2O_5$, $MoO_3$, $Ta_2O_5$, $WO_3$, $ZrO_2$, $Y_2O_3$, $La_2O_3$, $HfO_2$, CdO, $SnO_2$, $Fe_2O_3$, $CeO_2$, $As_2O_3$, $Sb_2O_3$, Cl, Br, or combinations thereof. In some embodiments, the glass is substantially free of $ZrO_2$. In some embodiments, the glass is substantially free of ZnO. The glass, in one embodiment, comprises 3 weight percent or less, for example, 0 to 3 weight percent, for example, greater than 0 to 3 weight percent, for example, 1 to 3 weight percent of $TiO_2$.

As mentioned above, the glasses, according some embodiments, comprise greater than 0 weight percent $B_2O_3$, for example, 1 weight percent or more, or, for example, 0 to 11 weight percent, for example, greater than 0 to 11 weight percent $B_2O_3$, for example, 0.5 to 11 weight percent $B_2O_3$, for example 1 to 11 weight percent $B_2O_3$. $B_2O_3$ is added to the glass to reduce melting temperature, to decrease liquidus temperature, to increase liquidus viscosity, and to improve mechanical durability relative to a glass containing no $B_2O_3$.

According to some embodiments, the glass is substantially free of $B_2O_3$. In some embodiments, the glass is substantially free of $B_2O_3$ and comprises at least 45 percent $SiO_2$, for example, at least 50 percent $SiO_2$, for example, at least 60 percent $SiO_2$.

The glass, according to some embodiments, comprises 30 weight percent total RO or less wherein RO is R is an alkaline earth metal selected from Mg, Ca, Ba, and Sr, for example, 20 weight percent total RO or less, for example, 15 weight percent total RO or less, for example, 13.5 weight percent total RO or less.

The glass can comprise, for example, 0 to 15, greater than 0 to 15 weight percent, for example, 1 to 15 weight percent MgO. The glass can comprise, for example, 0 to 7, greater than 0 to 7 weight percent, for example, 1 to 7 weight percent MgO. MgO can be added to the glass to reduce melting temperature and to increase strain point. It can disadvantageously lower CTE relative to other alkaline earths (e.g., CaO, SrO, BaO), and so other adjustments may be made to keep the CTE within the desired range. Examples of suitable adjustments include increase SrO at the expense of CaO, increasing alkali oxide concentration, and replacing a smaller alkali oxide in part with a larger alkali oxide.

According to another embodiment, the glass is substantially free of BaO. For example, the content of BaO can be 0.05 weight percent or less, for example, zero weight percent.

In some embodiments, the glass is substantially free of $Sb_2O_3$, $As_2O_3$, or combinations thereof, for example, the glass comprises 0.05 weight percent or less of $Sb_2O_3$ or $As_2O_3$ or a combination thereof. For example, the glass can comprise zero weight percent of $Sb_2O_3$ or $As_2O_3$ or a combination thereof.

The glasses, in some embodiments, comprise 0 to 10 weight percent CaO, for example, 0 to 7 weight percent CaO, or, for example, greater than 0, for example, 1 to 10 weight percent CaO, for example, 1 to 7 weight percent CaO. Relative to alkali oxides or SrO, CaO contributes to higher strain point, lower density, and lower melting temperature.

The glasses can comprise, in some embodiments, 0 to 12 weight percent SrO, for example, greater than zero to 12 weight percent, for example, 1 to 12 weight percent SrO, or for example, 0 to 5 weight percent SrO, for example, greater than zero to 5 weight percent, for example, 1 to 5 weight percent SrO. In certain embodiments, the glass contains no deliberately batched SrO, though it may of course be present as a contaminant in other batch materials. SrO contributes to higher coefficient of thermal expansion, and the relative proportion of SrO and CaO can be manipulated to improve liquidus temperature, and thus liquidus viscosity. SrO is not as effective as CaO or MgO for improving strain point, and replacing either of these with SrO tends to cause the melting temperature to increase.

Alkali cations such as K raise the CTE steeply, but also lower the strain point and, depending upon how they are added, increase melting temperatures. The least effective alkali oxide for CTE is $Li_2O$, and the most effective alkali oxide is $Cs_2O$.

Another embodiment is a glass consisting essentially of, in weight percent:
35 to 75 percent $SiO_2$;
0 to 15 percent $Al_2O_3$;
0 to 20 percent $B_2O_3$;
3 to 30 percent $K_2O$;
0 to 15 percent MgO;
0 to 10 percent CaO;
0 to 12 percent SrO;
0 to 40 percent BaO; and
0 to 1 percent $SnO_2$,
wherein the glass is substantially free of $Na_2O$.

The glass, according to some embodiments, is down-drawable; that is, the glass is capable of being formed into sheets using down-draw methods such as, but not limited to, fusion draw and slot draw methods that are known to those skilled in the glass fabrication arts. Such down-draw processes are used in the large-scale manufacture of ion-exchangeable flat glass.

The fusion draw process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank. These outside surfaces extend down and inwardly so that they join at an edge below the drawing tank. The two flowing glass surfaces join at this edge to fuse and form a single flowing sheet. The fusion draw method offers the advantage that, since the two glass films flowing over the channel fuse together, neither outside surface of the resulting glass sheet comes in contact with any part of the apparatus. Thus, the surface properties are not affected by such contact.

The slot draw method is distinct from the fusion draw method. Here the molten raw material glass is provided to a drawing tank. The bottom of the drawing tank has an open slot with a nozzle that extends the length of the slot. The molten glass flows through the slot/nozzle and is drawn downward as a continuous sheet therethrough and into an annealing region. Compared to the fusion draw process, the slot draw process provides a thinner sheet, as only a single sheet is drawn through the slot, rather than two sheets being fused together, as in the fusion down-draw process.

In order to be compatible with down-draw processes, the glass described herein has a high liquidus viscosity. In one embodiment, the glass has a liquidus viscosity of 50,000 poise or greater, for example, 150,000 poise or greater, for example, 200,000 poise or greater, for example, 250,000 poise or greater, for example, 300,000 poise or greater, for example, 350,000 poise or greater, for example, 400,000 poise or greater, for example, greater than or equal to 500,000 poise. The liquidus viscosities of some exemplary glasses are closely correlated with the difference between the liquidus temperature and the softening point. For down-draw processes, some exemplary glasses advantageously have liquidus—softening point less than about 230° C., for example, less than 200° C.

Accordingly, in one embodiment, the glass has a strain point of 540° C. or greater, for example, 550° C. or greater, for example, 560° C. or greater, or for example, from 540° C. to 650° C. In some embodiments, the glass has a coefficient of thermal expansion of $50 \times 10^{-7}$ or greater, for example, $60 \times 10^{-7}$ or greater, for example, $70 \times 10^{-7}$ or greater, for example, $80 \times 10^{-7}$ or greater. In one embodiment, the glass has a strain point of from $50 \times 10^{-7}$ to $90 \times 10^{-7}$.

In one embodiment, the glass has a coefficient of thermal expansion of $50 \times 10^{-7}$ or greater and a strain point of 540° C. or greater. In one embodiment, the glass has a coefficient of thermal expansion of $50 \times 10^{-7}$ or greater and a strain point of 560° C. or greater.

According to one embodiment, the glass is ion exchanged in a salt bath comprising one or more salts of alkali ions. The glass can be ion exchanged to change its mechanical properties. For example, smaller alkali ions, such as lithium can be ion-exchanged in a molten salt containing one or more larger alkali ions, such as potassium, rubidium or cesium. If performed at a temperature well below the strain point for sufficient time, a diffusion profile will form in which the larger alkali moves into the glass surface from the salt bath, and the smaller ion is moved from the interior of the glass into the salt bath. When the sample is removed, the surface will go under compression, producing enhanced toughness against damage. Such toughness may be desirable in instances where the glass will be exposed to adverse environmental conditions, such as photovoltaic grids exposed to hail. A large alkali already in the glass can also be exchanged for a smaller alkali in a salt bath. If this is performed at temperatures close to the strain point, and if the glass is removed and its surface rapidly reheated to high temperature and rapidly cooled, the surface of the glass will show considerable compressive stress introduced by thermal tempering. This will also provide protection against adverse environmental conditions. It will be clear to one skilled in the art that any monovalent cation can be exchanged for alkalis already in the glass, including copper, silver, thallium, etc., and these also provide attributes of potential value to end uses, such as introducing color for lighting or a layer of elevated refractive index for light trapping.

According to another embodiment, the glass can be float formed as known in the art of float forming glass.

In one embodiment, the glass is in the form of a sheet. The glass in the form of a sheet can be thermally tempered.

In one embodiment, an Organic Light Emitting Diode device comprises the glass in the form of a sheet.

The glass, according to one embodiment, is transparent.

In one embodiment, a photovoltaic device comprises the glass in the form of a sheet. The photovoltaic device can comprise more than one of the glass sheets, for example, as a substrate and/or as a superstrate. In one embodiment, the photovoltaic device comprises the glass sheet as a substrate and/or superstrate, a conductive material adjacent to the substrate, and an active photovoltaic medium adjacent to the conductive material. In one embodiment, the active photovoltaic medium comprises a CIGS layer. In one embodiment, the active photovoltaic medium comprises a cadmium telluride (CdTe) layer. In one embodiment, the photovoltaic device comprises a functional layer comprising copper indium gallium diselenide or cadmium telluride. In one embodiment, the photovoltaic device the functional layer is copper indium gallium diselenide. In one embodiment, the functional layer is cadmium telluride.

The photovoltaic device, according to one embodiment, further comprises a barrier layer disposed between or adjacent to the superstrate or substrate and the functional layer. In one embodiment, the photovoltaic device further comprises a barrier layer disposed between or adjacent to the superstrate or substrate and a transparent conductive oxide (TCO) layer, wherein the TCO layer is disposed between or adjacent to the functional layer and the barrier layer. A TCO may be present in a photovoltaic device comprising a CdTe functional layer. In one embodiment, the barrier layer is disposed directly on the glass.

In one embodiment, the glass sheet is transparent. In one embodiment, the glass sheet as the substrate and/or superstrate is transparent.

According to some embodiments, the glass sheet has a thickness of 4.0 mm or less, for example, 3.5 mm or less, for example, 3.2 mm or less, for example, 3.0 mm or less, for example, 2.5 mm or less, for example, 2.0 mm or less, for example, 1.9 mm or less, for example, 1.8 mm or less, for example, 1.5 mm or less, for example, 1.1 mm or less, for example, 0.5 mm to 2.0 mm, for example, 0.5 mm to 1.1 mm, for example, 0.7 mm to 1.1 mm. Although these are exemplary thicknesses, the glass sheet can have a thickness of any numerical value including decimal places in the range of from 0.1 mm up to and including 4.0 mm.

In one embodiment, an electrochromic device comprises the glass in the form of a sheet. The electrochromic device can be, for example, an electrochromic window. In one embodiment, the electrochromic window comprises one or more of the glass sheets, such as in a single, double, or triple pane window.

The fusion-formable glasses of this invention, by virtue of their relatively high strain point, represent advantaged substrate materials for CIGS photovoltaic modules as they can enable higher temperature processing of the critical semiconductor layers. When manufactured by the fusion process, their superior surface quality relative to that of float glass may also result in further improvements to the photovoltaic module making process. Advantageous embodiments of this invention are characterized by liquidus viscosity in excess of 400,000 poise, thereby enabling the fabrication of the relatively thick glass sheet that may be required by some module manufacturers. Finally, the most advantageous embodiments of this invention comprise glasses for which the 200 poise temperature is less than 1580° C., providing for the possibility of significantly lower cost melting/forming.

EXAMPLES

The following is an example of how to fabricate a sample of an exemplary glass, according to one embodiment of the invention, as shown in Table 1. This composition corresponds to composition number 22 shown in Table 5.

TABLE 1

| oxide | mol % |
|---|---|
| $SiO_2$ | 64.93 |
| $Al_2O_3$ | 0 |

TABLE 1-continued

| oxide | mol % |
|---|---|
| MgO | 17.5 |
| CaO | 0 |
| SrO | 0 |
| $B_2O_3$ | 0 |
| $K_2O$ | 17.5 |
| $SnO_2$ | 0.10 |
| BaO | 0 |

In some embodiments, the total does not add up to 100%, since certain tramp elements are present at non-negligible concentrations.

Batch materials, as shown in Table 2 were weighed and added to a 4 liter plastic container:

TABLE 2

| Batch Components |
|---|
| sand |
| Magnesia |
| Potassium carbonate |
| 10% $SnO_2$ and 90% sand |

It should be appreciated that in the batch, limestone, depending on the source can contain tramp elements and/or vary amounts of one or more oxides, for example, MgO and/or BaO. The sand is advantageously beneficiated so that at least 80% by mass passes 60 mesh, for example 80 mesh, for example 100 mesh. The $SnO_2$ added, in this example, was pre-mixed with sand at a level of 10% by weight so as to ensure homogeneous mixing with the other components. The bottle containing the batch materials was mounted to a tumbler and the batch materials were mixed so as to make a homogeneous batch and to break up soft agglomerates. The mixed batch was transferred to a 1800 cc platinum crucible and placed into a high-temperature ceramic backer. The platinum in its backer was loaded into a glo-bar furnace idling at a temperature of 1600° C. After 16 hours, the crucible+backer was removed and the glass melt was poured onto a cold surface, such as a steel plate, to form a patty, and then transferred to an annealer held at a temperature of 615° C. The glass patty was held at the annealer temperature for 2 hours, then cooled at a rate of 1° C. per minute to room temperature.

Table 3, Table 4, Table 5, Table 6, Table 7, Table 8, and Table 9 show exemplary glasses, according to embodiments of the invention, and made according to the above example. Properties data for some exemplary glasses are also shown in Table 3, Table 4, Table 5, Table 6, Table 7, Table 8, and Table 9.

In the Tables $T_{str}$(° C.) is the strain point which is the temperature when the viscosity is equal to $10^{14.7}$ P as measured by beam bending or fiber elongation. $T_{ann}$(° C.) is the annealing point which is the temperature when the viscosity is equal to $10^{13.18}$ P as measured by beam bending or fiber elongation. $T_s$(° C.) is the softening point which is the temperature when the viscosity is equal to $10^{7.6}$ P as measured by beam bending or fiber elongation. $\alpha(10^{-7}/°$ C.) or $a(10^{-7}/°$ C.) in the Tables is the coefficient of thermal expansion (CTE) which is the amount of dimensional change from either 0 to 300° C. or 25 to 300° C. depending on the measurement. CTE is typically measured by dilatometry. r(g/cc) is the density which is measured with the Archimedes method (ASTM C693). $T_{200}$(° C.) is the two-hundred Poise (P) temperature. This is the temperature when the viscosity of the melt is 200 P as measured by HTV (high temperature viscosity) measurement which uses concentric cylinder viscometry. $T_{liq}$(° C.) is the liquidus temperature. This is the temperature where the first crystal is observed in a standard gradient boat liquidus measurement (ASTM C829-81). Generally this test is 72 hours but can be as short as 24 hours to increase throughput at the expense of accuracy (shorter tests could underestimate the liquidus temperature). $\eta_{liq}$(° C.) is the liquidus viscosity. This is the viscosity of the melt corresponding to the liquidus temperature.

TABLE 3

| Example | 1 | 2 | 3 | 4 | 5 | 6 | 7 | 8 | 9 | 10 |
|---|---|---|---|---|---|---|---|---|---|---|
| Composition (mol %) | | | | | | | | | | |
| $K_2O$ | 3 | 4.5 | 6 | 4.95 | 12.1 | 12.1 | 12 | 12 | 12 | 10 |
| MgO | 0 | 0 | 0 | 0 | 1.7 | 3.38 | 3.8 | 4.4 | 4 | 5.2 |
| CaO | 0 | 0 | 0 | 0 | 6.76 | 3.38 | 3.8 | 4.4 | 4 | 5.2 |
| SrO | 0.41 | 0.31 | 0.21 | 0.28 | 0 | 1.7 | 1.9 | 2.2 | 2 | 2.6 |
| BaO | 20.29 | 15.19 | 10.12 | 13.67 | 0 | 0 | 0 | 0 | 0 | 0 |
| $B_2O_3$ | 18.67 | 14 | 9.33 | 12.6 | 3.03 | 3.03 | 3 | 1.5 | 1.5 | 1.5 |
| $Al_2O_3$ | 3 | 4.5 | 6 | 4.95 | 4.88 | 4.88 | 4 | 4 | 5 | 4 |
| $SiO_2$ | 54.67 | 61.5 | 68.33 | 63.55 | 71.43 | 71.43 | 71.4 | 71.4 | 71.4 | 71.4 |
| $SnO_2$ | 0 | 0 | 0 | 0.1 | 0.1 | 0.1 | 0.1 | 0.1 | 0.1 | 0.1 |
| Composition (wt %) | | | | | | | | | | |
| $K_2O$ | 3.4 | 5.35 | 7.52 | 5.97 | 17.2 | 17.1 | 17.1 | 17.1 | 17 | 14.4 |
| MgO | 0 | 0 | 0 | 0 | 1.04 | 2.05 | 2.32 | 2.68 | 2.43 | 3.2 |
| CaO | 0 | 0 | 0 | 0 | 5.73 | 2.84 | 3.21 | 3.73 | 3.37 | 4.46 |
| SrO | 0.51 | 0.41 | 0.29 | 0.37 | 0 | 2.64 | 2.97 | 3.44 | 3.11 | 4.12 |
| BaO | 37.3 | 29.4 | 20.7 | 26.9 | 0 | 0 | 0 | 0 | 0 | 0 |
| $B_2O_3$ | 15.6 | 12.3 | 8.64 | 11.2 | 3.18 | 3.16 | 3.15 | 1.58 | 1.57 | 1.6 |
| $Al_2O_3$ | 3.68 | 5.79 | 8.14 | 6.46 | 7.53 | 7.46 | 6.16 | 6.17 | 7.66 | 6.24 |
| $SiO_2$ | 39.4 | 46.6 | 54.6 | 48.9 | 64.9 | 64.3 | 64.7 | 64.9 | 64.5 | 65.6 |
| $SnO_2$ | 0 | 0 | 0 | 0.19 | 0.23 | 0.23 | 0.23 | 0.23 | 0.23 | 0.23 |
| $T_{str}$ (° C.) | 578 | ~580 | 584 | 588 | 597 | 591 | 591 | 595 | 604 | 606 |
| $T_{ann}$ (° C.) | 616 | ~620 | 627 | 625 | 644 | 640 | 638 | 645 | 655 | 657 |
| $T_s$ (° C.) | 754 | 770 | 815 | 790 | | | | | | |

TABLE 3-continued

| Example | 1 | 2 | 3 | 4 | 5 | 6 | 7 | 8 | 9 | 10 |
|---|---|---|---|---|---|---|---|---|---|---|
| a ($10^{-7}$/° C.) | 71.9 | 70.6 | 65.3 | 66.8 | 79.9 | 79.6 | 80.2 | 82.5 | 80.5 | 76 |
| r (gm/cc) | | | 2.901 | 2.446 | 2.462 | 2.472 | 2.483 | 2.473 | 2.493 | |
| $T_{200}$ (° C.) | 1111 | 1254 | 1443 | 1410 | 1595 | 1624 | 1589 | 1617 | 1622 | 1613 |
| $T_{liq}$ (° C.) | 885 | 905 | 910 | 910 | 1060 | 975 | 950 | 995 | 1085 | 1050 |
| $\eta_{liq}$ (kp) | 37 | 110 | 724 | 235 | 129 | 1221 | 1675 | 910 | 156 | 298 |

TABLE 4

| Example | 11 | 12 | 13 | 14 | 15 | 16 | 17 | 18 | 19 | 20 |
|---|---|---|---|---|---|---|---|---|---|---|
| Composition (mol %) | | | | | | | | | | |
| $K_2O$ | 12 | 12 | 12 | 12 | 10 | 12 | 12 | 12 | 12 | 12 |
| MgO | 3.4 | 3 | 4.2 | 4.8 | 5.6 | 4 | 4.4 | 5 | 3.67 | 1.84 |
| CaO | 3.4 | 3 | 4.2 | 4.8 | 5.6 | 4 | 4.4 | 5 | 5.5 | 7.33 |
| SrO | 1.7 | 1.5 | 2.1 | 2.4 | 2.8 | 2 | 2.2 | 2.5 | 1.82 | 1.82 |
| BaO | 0 | 0 | 0 | 0 | 0 | 0 | 0 | 0 | 0.01 | 0.01 |
| $B_2O_3$ | 4 | 4 | 3 | 1.5 | 1.5 | 4 | 3 | 1.5 | 1.5 | 1.5 |
| $Al_2O_3$ | 4 | 5 | 3 | 3 | 3 | 2.5 | 2.5 | 2.5 | 4 | 4 |
| $SiO_2$ | 71.4 | 71.4 | 71.4 | 71.4 | 71.4 | 71.4 | 71.4 | 71.4 | 71.4 | 71.4 |
| $SnO_2$ | 0.1 | 0.1 | 0.1 | 0.1 | 0.1 | 0.1 | 0.1 | 0.1 | 0.1 | 0.1 |
| Composition (wt %) | | | | | | | | | | |
| $K_2O$ | 17 | 16.9 | 17.2 | 17.2 | 14.5 | 17.2 | 17.2 | 17.3 | 17.1 | 17 |
| MgO | 2.07 | 1.81 | 2.57 | 2.94 | 3.47 | 2.46 | 2.7 | 3.07 | 2.24 | 1.12 |
| CaO | 2.87 | 2.52 | 3.57 | 4.1 | 4.83 | 3.41 | 3.76 | 4.28 | 4.67 | 6.2 |
| SrO | 2.65 | 2.33 | 3.3 | 3.78 | 4.46 | 3.15 | 3.47 | 3.95 | 2.86 | 2.85 |
| BaO | 0 | 0 | 0 | 0 | 0 | 0 | 0 | 0 | 0.02 | 0.02 |
| $B_2O_3$ | 4.19 | 4.17 | 3.17 | 1.59 | 1.61 | 4.23 | 3.18 | 1.6 | 1.58 | 1.58 |
| $Al_2O_3$ | 6.15 | 7.64 | 4.64 | 4.65 | 4.71 | 3.87 | 3.88 | 3.89 | 6.17 | 6.15 |
| $SiO_2$ | 64.6 | 64.2 | 65.1 | 65.3 | 66 | 65.3 | 65.4 | 65.6 | 65 | 64.7 |
| $SnO_2$ | 0.23 | 0.23 | 0.23 | 0.23 | 0.23 | 0.23 | 0.23 | 0.23 | 0.23 | 0.23 |
| $T_{str}$ (° C.) | 585 | 590 | 585 | 592 | 602 | 582 | 586 | 588 | 598 | 600 |
| $T_{ann}$ (° C.) | 632 | 638 | 631 | 640 | 651 | 627 | 632 | 636 | 647 | 648 |
| $T_s$ (° C.) | | | | | | | | | | |
| a ($10^{-7}$/° C.) | 79.4 | 78.1 | 79.5 | 83.8 | 77 | 81.9 | 81.5 | 84.4 | 82 | 84.2 |
| r (gm/cc) | 2.466 | 2.451 | 2.483 | 2.494 | 2.502 | 2.485 | 2.489 | 2.497 | 2.478 | 2.492 |
| $T_{200}$ (° C.) | 1596 | 1625 | 1553 | 1553 | 1556 | 1527 | 1508 | 1523 | 1585 | 1549 |
| $T_{liq}$ (° C.) | <900 | 940 | <950 | 960 | 1040 | <850 | 870 | 940 | 985 | 1030 |
| $\eta_{liq}$ (kp) | >2000 | 2143 | >1000 | 1080 | 202 | >7000 | 6297 | 1385 | 660 | 179 |

TABLE 5

| Example | 21 | 22 | 23 | 24 | 25 | 26 | 27 | 28 | 29 | 30 |
|---|---|---|---|---|---|---|---|---|---|---|
| Composition (mol %) | | | | | | | | | | |
| $K_2O$ | 12 | 17.5 | 14.94 | 10.8 | 9.6 | 12.47 | 13.6 | 12.6 | 13.35 | 11.77 |
| MgO | 1.83 | 17.5 | 1.37 | 5.17 | 4.59 | 11.02 | 12.9 | 13.9 | 13.7 | 11.94 |
| CaO | 5.5 | 0 | 1.11 | 6.21 | 10.18 | 3.13 | 2.4 | 2.4 | 1.75 | 0.86 |
| SrO | 3.65 | 0 | 0.77 | 1.4 | 1.24 | 1.01 | 1.45 | 1.45 | 1.1 | 0.66 |
| BaO | 0.02 | 0 | 0 | 0 | 0 | 0 | 0 | 0 | 0 | 3.04 |
| $B_2O_3$ | 1.5 | 0 | 0.4 | 3.52 | 6.24 | 1.64 | 0.4 | 0.4 | 1.9 | 3.11 |
| $Al_2O_3$ | 4 | 0 | 4.17 | 4.32 | 3.84 | 3.13 | 2.35 | 2.35 | 2.3 | 2.76 |
| $SiO_2$ | 71.4 | 64.93 | 77.17 | 68.51 | 64.24 | 67.53 | 66.8 | 66.8 | 65.8 | 65.79 |
| $SnO_2$ | 0.1 | 0.07 | 0.07 | 0.07 | 0.07 | 0.07 | 0.1 | 0.1 | 0.1 | 0.07 |
| Composition (wt %) | | | | | | | | | | |
| $K_2O$ | 16.8 | 26.3 | 21 | 15.6 | 13.9 | 18.3 | 20 | 18.7 | 19.7 | 16.7 |
| MgO | 1.1 | 11.2 | 0.82 | 3.18 | 2.85 | 6.93 | 8.13 | 8.83 | 8.67 | 7.24 |
| CaO | 4.59 | 0 | 0.93 | 5.32 | 8.78 | 2.73 | 2.11 | 2.13 | 1.54 | 0.73 |
| SrO | 5.63 | 0 | 1.19 | 2.22 | 1.98 | 1.64 | 2.34 | 2.36 | 1.79 | 1.03 |
| BaO | 0.05 | 0 | 0 | 0 | 0 | 0 | 0 | 0 | 0 | 7.02 |
| $B_2O_3$ | 1.56 | 0 | 0.42 | 3.74 | 6.69 | 1.78 | 0.44 | 0.44 | 2.08 | 3.25 |
| $Al_2O_3$ | 6.07 | 0 | 6.33 | 6.73 | 6.03 | 4.98 | 3.74 | 3.78 | 3.68 | 4.23 |
| $SiO_2$ | 63.8 | 62.1 | 69 | 62.9 | 59.4 | 63.3 | 62.8 | 63.3 | 62.1 | 59.5 |
| $SnO_2$ | 0.22 | 0.17 | 0.16 | 0.16 | 0.16 | 0.16 | 0.24 | 0.24 | 0.24 | 0.16 |
| $T_{str}$ (° C.) | 593 | 610 | 565 | 592 | 594 | 595 | 594 | 602 | 592 | 576 |
| $T_{ann}$ (° C.) | 641 | 661 | 616 | 638 | 634 | 647 | 649 | 656 | 641 | 624 |

TABLE 5-continued

| Example | 21 | 22 | 23 | 24 | 25 | 26 | 27 | 28 | 29 | 30 |
|---|---|---|---|---|---|---|---|---|---|---|
| $T_s$ (° C.) | | 879 | 847 | 847 | 815 | 866 | 874 | 879 | 858 | 835 |
| a ($10^{-7}$/° C.) | 84 | 104.1 | 88.6 | 78 | 77.8 | 85 | 89.9 | 85.7 | 87.9 | 83.7 |
| r (gm/cc) | 2.523 | 2.444 | 2.418 | 2.483 | 2.512 | 2.472 | 2.483 | 2.485 | 2.468 | 2.558 |
| $T_{200}$ (° C.) | 1547 | | | 1535 | | 1531 | | | 1502 | 1473 |
| $T_{liq}$ (° C.) | 1010 | <1150 | <950 | 1050 | 1080 | 1075 | 1080 | 1080 | 1060 | 990 |
| $\eta_{liq}$ (kp) | 251 | | | 103 | | 109 | ~75 | ~86 | 106 | 290 |

TABLE 6

| Example | 31 | 32 | 33 | 34 | 35 | 36 | 37 | 38 | 39 | 40 |
|---|---|---|---|---|---|---|---|---|---|---|
| Composition (mol %) | | | | | | | | | | |
| $K_2O$ | 14 | 12 | 11.76 | 11.73 | 10.96 | 16 | 14.61 | 12.19 | 14.1 | 14.1 |
| MgO | 2.9 | 3.9 | 3.82 | 6.57 | 6.14 | 0 | 1.38 | 3.79 | 1.33 | 0 |
| CaO | 2.85 | 3.65 | 3.58 | 5.77 | 5.39 | 5 | 5.32 | 5.89 | 5.14 | 5.13 |
| SrO | 0.7 | 0.9 | 0.88 | 1.88 | 1.75 | 0 | 0 | 1.03 | 0 | 1.33 |
| BaO | 0 | 0 | 0 | 0 | 0 | 0 | 0 | 0 | 0 | 0 |
| $B_2O_3$ | 3.03 | 3.03 | 5 | 1.55 | 1.45 | 3 | 3.14 | 3.38 | 3.03 | 3.03 |
| $Al_2O_3$ | 4.9 | 4.9 | 4.8 | 2.91 | 2.72 | 5.34 | 5.06 | 4.59 | 4.89 | 4.88 |
| $SiO_2$ | 71.52 | 71.52 | 70.06 | 69.5 | 71.5 | 70.56 | 70.39 | 69.06 | 71.49 | 71.42 |
| $SnO_2$ | 0.1 | 0.1 | 0.1 | 0.1 | 0.1 | 0 | 0.1 | 0.1 | 0.1 | 0.1 |
| Composition (wt %) | | | | | | | | | | |
| $K_2O$ | 19.7 | 17.1 | 16.7 | 17 | 16 | 22.2 | 20.5 | 17.4 | 19.9 | 19.6 |
| MgO | 1.75 | 2.38 | 2.33 | 4.07 | 3.83 | 0 | 0.83 | 2.31 | 0.8 | 0 |
| CaO | 2.39 | 3.09 | 3.02 | 4.98 | 4.67 | 4.13 | 4.45 | 4.99 | 4.31 | 4.25 |
| SrO | 1.08 | 1.41 | 1.38 | 2.99 | 2.8 | 0 | 0 | 1.62 | 0 | 2.04 |
| BaO | 0 | 0 | 0 | 0 | 0 | 0 | 0 | 0 | 0 | 0 |
| $B_2O_3$ | 3.14 | 3.18 | 5.25 | 1.66 | 1.56 | 3.07 | 3.26 | 3.55 | 3.16 | 3.12 |
| $Al_2O_3$ | 7.46 | 7.55 | 7.39 | 4.57 | 4.29 | 8 | 7.69 | 7.07 | 7.45 | 7.36 |
| $SiO_2$ | 64.1 | 64.9 | 63.5 | 64.3 | 66.4 | 62.4 | 62.8 | 62.7 | 64.2 | 63.4 |
| $SnO_2$ | 0.23 | 0.23 | 0.23 | 0.23 | 0.23 | 0 | 0.23 | 0.23 | 0.22 | 0.21 |
| $T_{str}$ (° C.) | 597 | 613 | 608 | 598 | 607 | 565 | 588 | 594 | 595 | 590 |
| $T_{ann}$ (° C.) | 645 | 663 | 658 | 646 | 658 | 611 | 633 | 640 | 640 | 635 |
| $T_s$ (° C.) | | | | | | | | | | |
| a ($10^{-7}$/° C.) | 84.8 | 78.1 | 74.7 | 85.1 | 81.1 | 90 | 88 | 82.3 | 86.1 | 86 |
| r (gm/cc) | 2.446 | 2.441 | 2.434 | 2.498 | 2.48 | | 2.452 | 2.473 | 2.446 | 2.475 |
| $T_{200}$ (° C.) | 1624 | 1649 | 1648 | 1515 | 1557 | | 1554 | 1558 | 1594 | 1567 |
| $T_{liq}$ (° C.) | 1010 | 1010 | 960 | 1010 | 1010 | 1010 | 1040 | 1035 | 990 | 980 |
| $\eta_{liq}$ (kp) | 376 | 886 | 2729 | 270 | 479 | | 105 | 169 | 394 | 407 |

TABLE 7

| Example | 41 | 42 | 43 | 44 | 45 | 46 | 47 | 48 | 49 |
|---|---|---|---|---|---|---|---|---|---|
| Composition (mol %) | | | | | | | | | |
| $K_2O$ | 12.37 | 10.32 | 11.97 | 13.21 | 9.21 | 12.37 | 4 | 8 | 5 |
| MgO | 1.17 | 1.16 | 1.33 | 1.24 | 0 | 1.17 | 1.75 | 12 | 4 |
| CaO | 4.51 | 4.49 | 2.13 | 4.81 | 5.14 | 4.51 | 7.02 | 1 | 7 |
| SrO | 0 | 1.18 | 2.99 | 0 | 4.14 | 0 | 2.91 | 7 | 1 |
| BaO | 0 | 1.18 | 1.69 | 0 | 2 | 0 | 3.32 | 7 | 12 |
| $B_2O_3$ | 2.66 | 2.64 | 2.99 | 2.84 | 3.03 | 3.36 | 10.67 | 1 | 0 |
| $Al_2O_3$ | 4.28 | 4.26 | 4.99 | 4.58 | 4.89 | 4.28 | 8.52 | 0 | 0 |
| $SiO_2$ | 75.01 | 74.65 | 71.81 | 73.23 | 71.49 | 74.01 | 62.25 | 64 | 71 |
| $SnO_2$ | 0.1 | 0.1 | 0.1 | 0.1 | 0.1 | 0.1 | 0.1 | 0.1 | 0.1 |
| Composition (wt %) | | | | | | | | | |
| $K_2O$ | 17.6 | 14.5 | 16.3 | 18.7 | 12.5 | 17.6 | 5.36 | 10.7 | 6.5 |
| MgO | 0.71 | 0.7 | 0.77 | 0.75 | 0 | 0.71 | 1.01 | 6.89 | 2.22 |
| CaO | 3.82 | 3.75 | 1.73 | 4.05 | 4.16 | 3.82 | 5.6 | 0.8 | 5.41 |
| SrO | 0 | 1.83 | 4.47 | 0 | 6.2 | 0 | 4.3 | 10.3 | 1.43 |
| BaO | 0 | 2.71 | 3.73 | 0 | 4.43 | 0 | 7.24 | 15.3 | 25.4 |
| $B_2O_3$ | 2.8 | 2.75 | 3.01 | 2.97 | 3.05 | 3.54 | 10.6 | 0.99 | 0 |
| $Al_2O_3$ | 6.59 | 6.48 | 7.34 | 7.02 | 7.2 | 6.6 | 12.4 | 0 | 0 |
| $SiO_2$ | 68.1 | 66.9 | 62.3 | 66.1 | 62.1 | 67.3 | 53.2 | 54.7 | 58.8 |
| $SnO_2$ | 0.23 | 0.22 | 0.22 | 0.23 | 0.22 | 0.23 | 0.21 | 0.21 | 0.21 |
| $T_{str}$ (° C.) | 602 | 604 | 592 | 599 | 623 | 603 | | 582 | 608 |

TABLE 7-continued

| Example | 41 | 42 | 43 | 44 | 45 | 46 | 47 | 48 | 49 |
|---|---|---|---|---|---|---|---|---|---|
| $T_{ann}$ (° C.) | 651 | 653 | 639 | 647 | 672 | 651 | | 628 | 656 |
| $T_s$ (° C.) | | | | | | | | | |
| a ($10^{-7}$/° C.) | 74.2 | 74.2 | 81.3 | 81.2 | 73.5 | 78.1 | | 88.9 | 73 |
| r (gm/cc) | 2.424 | 2.485 | 2.451 | 2.435 | 2.585 | 2.428 | | 2.889 | 2.933 |
| $T_{200}$ (° C.) | 1637 | 1669 | 1586 | 1611 | 1613 | 1615 | 1491 | 1347 | 1406 |
| $T_{liq}$ (° C.) | 800 | 940 | 980 | 945 | 1090 | | 960 | 1000 | 1005 |
| $\eta_{liq}$ (kp) | 427,000 | 4527 | 301 | 1829 | 107 | | 665 | 59 | 156 |

TABLE 8

| Example | 50 | 51 | 52 | 53 | 54 | 55 | 56 |
|---|---|---|---|---|---|---|---|
| Composition (mol %) | | | | | | | |
| $K_2O$ | 11.79 | 11.91 | 12.04 | 11.25 | 8.96 | 10.9 | 10.79 |
| MgO | 6.03 | 4.95 | 3.87 | 6.3 | 7.06 | 6.11 | 6.05 |
| CaO | 5.64 | 5.39 | 5.13 | 5.53 | 6.21 | 5.36 | 5.31 |
| SrO | 1.69 | 1.32 | 0.94 | 1.8 | 2.01 | 1.74 | 1.72 |
| BaO | 0 | 0 | 0 | 0 | 0 | 0 | 0 |
| $B_2O_3$ | 1.66 | 1.88 | 2.11 | 5.55 | 1.45 | 1.44 | 2.44 |
| $Al_2O_3$ | 3.05 | 3.32 | 3.6 | 2.79 | 2.72 | 3.22 | 3.19 |
| $SiO_2$ | 70.04 | 71.13 | 72.21 | 66.68 | 71.5 | 71.13 | 70.4 |
| $SnO_2$ | 0.1 | 0.1 | 0.1 | 0.1 | 0.1 | 0.1 | 0.1 |
| Composition (wt %) | | | | | | | |
| $K_2O$ | 17.06 | 17.18 | 17.3 | 16.27 | 13.22 | 15.84 | 15.66 |
| MgO | 3.73 | 3.05 | 2.38 | 3.9 | 4.45 | 3.8 | 3.76 |
| CaO | 4.86 | 4.63 | 4.39 | 4.76 | 5.45 | 4.63 | 4.59 |
| SrO | 2.69 | 2.1 | 1.49 | 2.86 | 3.26 | 2.78 | 2.74 |
| BaO | 0 | 0 | 0 | 0 | 0 | 0 | 0 |
| $B_2O_3$ | 1.78 | 2.01 | 2.25 | 5.93 | 1.58 | 1.55 | 2.62 |
| $Al_2O_3$ | 4.78 | 5.18 | 5.6 | 4.36 | 4.34 | 5.06 | 5.01 |
| $SiO_2$ | 64.66 | 65.43 | 66.18 | 61.49 | 67.27 | 65.91 | 65.19 |
| $SnO_2$ | 0.23 | 0.23 | 0.23 | 0.23 | 0.24 | 0.23 | 0.23 |
| $T_{str}$ (° C.) | 596 | 597 | 601 | 612 | 627 | 624 | 622 |
| $T_{ann}$ (° C.) | 645 | 646 | 651 | 660 | 679 | 671 | 674 |
| $T_s$ (° C.) | | | | | | | |
| a ($10^{-7}$/° C.) | 83.3 | 82.6 | 82.5 | 71.9 | 72.4 | 78.3 | 74.9 |
| r (gm/cc) | 2.486 | 2.473 | 2.458 | 2.48 | 2.483 | 2.477 | 2.473 |
| $T_{200}$ (° C.) | 1543 | 1560 | 1608 | 1557 | 1560 | 1576 | 1613 |
| $T_{liq}$ (° C.) | 995 | 985 | 950 | 1080 | 1095 | 1020 | 1055 |
| $\eta_{liq}$ (kp) | 480 | 688 | 2361 | 76 | 96 | 553 | 329 |

TABLE 9

| Example | 57 | 58 | 59 | 60 | 61 | 62 | 63 |
|---|---|---|---|---|---|---|---|
| Composition (mol %) | | | | | | | |
| $K_2O$ | 10.15 | 9.95 | 3.35 | 3.75 | 4.1 | 3.64 | 10.1 |
| MgO | 5.69 | 5.58 | 5.39 | 6.04 | 6.59 | 5.87 | 5.66 |
| CaO | 4.99 | 4.89 | 5.57 | 6.24 | 6.81 | 6.06 | 4.96 |
| SrO | 1.62 | 1.59 | 2.3 | 2.58 | 2.81 | 2.51 | 1.61 |
| BaO | 0 | 2 | 0 | 0 | 0 | 0 | 0 |
| $B_2O_3$ | 1.34 | 1.31 | 5.69 | 5.69 | 5.69 | 5.53 | 1.33 |
| $Al_2O_3$ | 3 | 2.94 | 11.26 | 10.46 | 9.78 | 10.16 | 3.5 |
| $SiO_2$ | 73.11 | 71.64 | 66.37 | 65.17 | 64.15 | 66.17 | 72.74 |
| $SnO_2$ | 0.1 | 0.1 | 0.07 | 0.07 | 0.07 | 0.07 | 0.1 |
| total | 100 | 100 | 100 | 100 | 100 | 100.01 | 100 |
| Composition (wt %) | | | | | | | |
| $K_2O$ | 14.82 | 14.14 | 4.75 | 5.34 | 5.86 | 5.2 | 14.7 |
| MgO | 3.55 | 3.39 | 3.27 | 3.68 | 4.03 | 3.58 | 3.52 |
| CaO | 4.34 | 4.13 | 4.7 | 5.29 | 5.79 | 5.15 | 4.3 |
| SrO | 2.61 | 2.49 | 3.59 | 4.04 | 4.41 | 3.94 | 2.58 |
| BaO | 0 | 4.62 | 0 | 0 | 0 | 0 | 0 |

TABLE 9-continued

| Example | 57 | 58 | 59 | 60 | 61 | 62 | 63 |
|---|---|---|---|---|---|---|---|
| $B_2O_3$ | 1.45 | 1.38 | 5.97 | 5.99 | 6.01 | 5.84 | 1.43 |
| $Al_2O_3$ | 4.74 | 4.52 | 17.3 | 16.12 | 15.15 | 15.7 | 5.51 |
| $SiO_2$ | 68.09 | 64.94 | 60.09 | 59.2 | 58.44 | 60.26 | 67.54 |
| $SnO_2$ | 0.23 | 0.23 | 0.16 | 0.16 | 0.16 | 0.16 | 0.23 |
| total | 99.83 | 99.84 | 99.83 | 99.82 | 99.85 | 99.83 | 99.81 |
| $T_{str}$ (° C.) | 609 | 598 | 660 | 645 | 632 | 645 | 621 |
| $T_{ann}$ (° C.) | 658 | 645 | 714 | 694 | 678 | 694 | 671 |
| $T_s$ (° C.) | | | | | | | |
| a ($10^{-7}$/° C.) | 76.2 | 79.7 | 46.7 | 52.8 | 55.5 | 50 | 75 |
| r (gm/cc) | 2.462 | 2.544 | 2.463 | 2.504 | 2.517 | 2.474 | 2.46 |
| $T_{200}$ (° C.) | 1605 | 1569 | 1609 | 1597 | 1555 | 1600 | 1613 |
| $T_{liq}$ (° C.) | 1000 | 950 | 1110 | 1080 | 1080 | 1065 | 1025 |
| $\eta_{liq}$ (kP) | 967 | 2257 | 287 | 432 | 228 | 695 | 682 |

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A glass comprising, in weight percent:
   45 to 75 percent SiO2;
   3 to 15 percent Al2O3;
   1.6 to 20 percent B2O3
   14 to 25 percent K2O;
   0 to less than 6 percent MgO;
   0 to 10 percent CaO
   0 to less than 5 percent SrO;
   0 to 3.32 percent BaO; and
   greater than 0 to 1 percent SnO2,
wherein the glass is substantially free of Na2O and wherein the glass is fusion formable and has a strain point of 540° C. or greater, a coefficient of thermal expansion of $50 \times 10^{-7}$/° C. or greater, T200 less than 1630° C., and having a liquidus viscosity of 150,000 poise or greater.

2. The glass of claim 1, having a liquidus viscosity of 1675 kilopoise or higher.

3. The glass of claim 2, comprising 0 to 15% by weight MgO.

4. The glass according to claim 2, comprising greater than 0 percent MgO, CaO, SrO, or combinations thereof.

5. The glass according to claim 2, wherein the glass is in the form of a sheet.

6. The glass according to claim 5, wherein the sheet has a thickness in the range of from 0.5 mm to 3.0 mm.

7. The glass according to claim 1, comprising greater than 0 percent MgO, CaO, SrO, or combinations thereof.

8. The glass according to claim 7, wherein the sheet has a thickness in the range of from 0.5 mm to 3.0 mm.

9. The glass according to claim 1, wherein the glass is in the form of a sheet.

10. A photovoltaic device comprising the glass according to claim 1.

11. The photovoltaic device according to claim 10, comprising a functional layer comprising copper indium gallium diselenide or cadmium telluride adjacent to the glass.

12. The photovoltaic device according to claim 11, further comprising a barrier layer disposed between the glass and the functional layer.

13. A glass comprising, in weight percent:
   45 to 75 percent SiO2;
   3 to 15 percent Al2O3;
   1.6 to 20 percent B2O3;
   14 to 25 percent K2O;
   0 to less than 15 percent MgO;
   0 to 10 percent CaO;
   0 to less than 5 percent SrO;
   0 to 3.32 percent BaO; and
   greater than 0 to 1 percent SnO2,
wherein the glass is substantially free of Na2O and wherein the glass is fusion formable and has a strain point of 540° C. or greater, a coefficient of thermal expansion of $70 \times 10^{-7}$/° C. or greater, T200 less than 1630° C., and having a liquidus viscosity of 150,000 poise or greater.

14. The glass of claim 13, having a liquidus viscosity of 1675 kilopoise or higher.

15. The glass according to claim 13, comprising greater than 0 percent MgO, CaO, SrO, or combinations thereof.

16. The glass according to claim 13, wherein the glass is in the form of a sheet.

17. The glass according to claim 16, wherein the sheet has a thickness in the range of from 0.5 mm to 3.0 mm.

* * * * *

UNITED STATES PATENT AND TRADEMARK OFFICE
CERTIFICATE OF CORRECTION

PATENT NO. : 10,173,919 B2
APPLICATION NO. : 15/651654
DATED : January 8, 2019
INVENTOR(S) : Aitken et al.

It is certified that error appears in the above-identified patent and that said Letters Patent is hereby corrected as shown below:

In the Claims

Column 17, Line 29, Claim 1, delete "B2O3" and insert -- $B_2O_3$; --, therefor.

Column 17, Line 32, Claim 1, delete "CaO" and insert -- CaO; --, therefor.

Column 18, Lines 41-42, Claim 13, delete "70×10-7/°C." and insert -- $70 \times 10^{-7}$/°C. --, therefor.

Signed and Sealed this
Twenty-third Day of June, 2020

Andrei Iancu
*Director of the United States Patent and Trademark Office*